(12) United States Patent
Koshimizu et al.

(10) Patent No.: US 7,501,312 B2
(45) Date of Patent: Mar. 10, 2009

(54) METHOD OF PROTECTING SEMICONDUCTOR WAFER AND ADHESIVE FILM FOR PROTECTION OF SEMICONDUCTOR WAFER

(75) Inventors: Takanobu Koshimizu, Nagoya (JP);
Makoto Kataoka, Sodegaura (JP);
Masafumi Miyakawa, Nagoya (JP);
Hideki Fukumoto, Nagoya (JP);
Yoshihisa Saimoto, Nagoya (JP)

(73) Assignee: Mitsui Chemicals, Inc., Tokyo (JP)

( * ) Notice: Subject to any disclaimer, the term of this patent is extended or adjusted under 35 U.S.C. 154(b) by 317 days.

(21) Appl. No.: 11/051,625

(22) Filed: Jan. 27, 2005

(65) Prior Publication Data

US 2005/0164509 A1 Jul. 28, 2005

(30) Foreign Application Priority Data

Jan. 28, 2004 (JP) ............................. 2004-019431

(51) Int. Cl.
*H01L 21/00* (2006.01)
*H01L 21/302* (2006.01)
*H01L 21/461* (2006.01)

(52) U.S. Cl. .............................. 438/118; 257/E21.237; 257/E21.505; 438/690

(58) Field of Classification Search ................ 438/118; 257/E21.237, E21.505
See application file for complete search history.

(56) References Cited

U.S. PATENT DOCUMENTS

| | | | | |
|---|---|---|---|---|
| 5,874,174 A | * | 2/1999 | Okuda et al. | 428/426 |
| 6,273,791 B1 | * | 8/2001 | Kataoka et al. | 451/41 |
| 6,558,975 B2 | * | 5/2003 | Sugino et al. | 438/64 |
| 6,656,601 B1 | * | 12/2003 | Kawachi et al. | 428/483 |
| 6,673,654 B2 | * | 1/2004 | Ohno et al. | 438/118 |
| 6,681,071 B2 | * | 1/2004 | Newton et al. | 385/113 |
| 2003/0064579 A1 | * | 4/2003 | Miyakawa et al. | 438/628 |
| 2003/0092845 A1 | * | 5/2003 | Takahashi et al. | 525/240 |
| 2003/0104199 A1 | | 6/2003 | Kondo et al. | |
| 2003/0134490 A1 | | 7/2003 | Inuzuka | |
| 2003/0219960 A1 | * | 11/2003 | Fukumoto et al. | 438/459 |

FOREIGN PATENT DOCUMENTS

| | | | |
|---|---|---|---|
| JP | 09-078040 | | 3/1997 |
| JP | 2000063571 A | * | 2/2000 |
| JP | 2002-075940 | | 3/2002 |
| JP | 2002-270676 | | 9/2002 |
| JP | 2003-238914 | | 8/2003 |
| JP | 2004259713 | * | 9/2004 |
| TW | 481878 B | | 4/2002 |
| TW | 564470 B | | 12/2003 |

* cited by examiner

*Primary Examiner*—Zandra Smith
*Assistant Examiner*—Daniel Luke
(74) *Attorney, Agent, or Firm*—Buchanan Ingersoll & Rooney PC

(57) ABSTRACT

A protecting method for a semiconductor wafer in a step of processing a semiconductor wafer which involves a first step of adhering an adhesive film for protection of a semiconductor wafer in which an adhesive layer is formed on one surface of a base film to a circuit-formed surface of the semiconductor wafer, a second step of heating the semiconductor wafer to which the adhesive film for protection of the semiconductor wafer is adhered, a third step of processing a non-circuit-formed surface of the semiconductor wafer by fixing the semiconductor wafer to which the adhesive film for protection of the semiconductor wafer is adhered on a grinding machine or an abrasive machine, and a fourth step of peeling the adhesive film for protection of the semiconductor wafer from the semiconductor wafer. The method addresses warpage problems and can prevent breakage of wafers during conveyance even if the thickness of a wafer is reduced to approximately 150 μm or less.

6 Claims, No Drawings

METHOD OF PROTECTING SEMICONDUCTOR WAFER AND ADHESIVE FILM FOR PROTECTION OF SEMICONDUCTOR WAFER

TECHNICAL FIELD

The present invention relates to protecting methods for semiconductor wafers using adhesive films for protection of semiconductor wafers and adhesive films for protection of semiconductor wafers used in said methods. Particularly, the present invention relates to a protecting method for a semiconductor wafer comprising adhering an adhesive film to a surface of a side on which an integrated circuit of a semiconductor wafer such as silicon, gallium-arsenide or the like is formed (circuit-formed plane or surface) to process the other surface of the wafer (non-circuit-formed plane or back side) and subsequently peeling the adhesive film away from the wafer, and an adhesive film used in said method. Further particularly, the present invention relates to a protecting method for a semiconductor wafer which prevents breakage of a semiconductor wafer on the way of its conveyance in a step of producing a thinned semiconductor chip, particularly a step of back side processing, a step of peeling an adhesive film and the like, thus enhancing the productivity, and an adhesive film used in said method.

BACKGROUND ART

In late years, as the spread of IC cards, portable communications equipment and the like, or miniaturization and thinning of electronic equipment have been in high demand, the thinning of a semiconductor chip has been further required. Conventionally, a thickness of a semiconductor chip was approximately 300 μm. However, the thinning of 150 μm or less has been required depending on its usage.

A semiconductor chip is generally manufactured through a step of adhering an adhesive film for protection of a semiconductor wafer to a surface of a semiconductor wafer on which an integrated circuit is formed, a step of thinning by processing a back side of a semiconductor wafer, a step of peeling the adhesive film for protection of the semiconductor wafer and a step of dicing the semiconductor wafer. Especially, when the thickness is removed to as low as 150 μm, the thickness is first thinned to approximately from 200 μm to 150 μm by means of a step of conventional grinding processing, and sometimes a grinding processing, a chemical etching processing and the like may be subsequently performed for further thinning.

However, such a thinned semiconductor wafer may tend to have a significant degree of warpage deformation due to deterioration of its rigidity, which becomes a manufacturing problem. Usually in a step of thinning a semiconductor chip, every piece of a semiconductor wafer is taken out of a wafer case by a robot and fixed to a jig which is called a chuck table in the processing machine to carry out a back side processing. The wafer after the back side processing is carried back into the wafer case by a robot or conveyed to the next step. If warpage in the wafer becomes significant during these steps, some of the steps may come to a halt because the wafer is broken or the robot can not convey the wafer and the like. Also, in a step of peeling an adhesive film for protection of a semiconductor wafer, serious problems such as breakage of wafers may occur because wafers are planarized by force in fixing the wafer to the chuck table in the peeling machine.

Such warpage is considered to occur by the residual stress of an adhesive film for protection of a semiconductor wafer which is adhered on the surface of a wafer and residual stress of an integrated circuit protection film which is mounted on the wafer surface. The residual stress of an adhesive film for protection of a semiconductor wafer occurs by tensile force which is applied to the adhesive film when it is adhered to the surface of the semiconductor wafer. Generally speaking, an adhesive film for protection of a semiconductor wafer using a flexible base film which is easily stretchable tends to cause big residual stresses, resulting in easily causing warpage in semiconductor wafers.

On the other hand, the residual stress applied to the circuit protection film is remarkable in the case of polyimide group protection films. Especially, if the polyimide group protection film is thick, warpage in the wafer increases by the residual stress of the polyimide group protecting film in thinning a semiconductor wafer. As a result, serious problems such as a halt of steps occur because wafers are broken or the robot can not convey the wafer and the like.

DISCLOSURE OF THE INVENTION

An object of the present invention is, in view of the above problems, to provide a protecting method for a semiconductor wafer which makes it possible to straighten or avoid warpage in a semiconductor wafer and to prevent breakage of wafers during conveyance of wafers even if the thickness of a semiconductor wafer is thinned to approximately 150 μm or less, and an adhesive film used in said method.

The present inventors have conducted an extensive study and, as a result, have found that the above problems could be solved by heating a semiconductor wafer to which an adhesive film for protection of a semiconductor wafer was adhered. Thus, the present invention has been completed.

That is, the first invention relates to a protecting method for a semiconductor wafer in a step of processing a semiconductor wafer comprising a first step of adhering an adhesive film for protection of a semiconductor wafer in which an adhesive layer is formed on one surface of a base film to a circuit-formed surface of the semiconductor wafer, a second step of heating the semiconductor wafer to which the adhesive film for protection of the semiconductor wafer is adhered, a third step of processing a non-circuit-formed surface of the semiconductor wafer by fixing the semiconductor wafer to which the adhesive film for protection of the semiconductor wafer is adhered on a grinding machine or an abrasive machine, and a fourth step of peeling the adhesive film for protection of the semiconductor wafer from the semiconductor wafer.

The base film comprises at least one resin layer having the ratio of residual stress of 0.5% or less after 30 seconds after load at 120° C., which is a preferred embodiment in view of the fact that stress in attaching the adhesive film for protection of the semiconductor wafer is relaxed. Further, the melt flow rate (hereinafter referred to also as MFR) at 190° C. specified in JIS K6730 of a resin layer having the residual stress of 0.5% or less after 30 seconds after load at 120° C. is from 15 g/10 min to 200 g/10 min, which is a preferred embodiment in view of the fact that stress in attaching the adhesive film for protection of the semiconductor wafer is relaxed.

Furthermore, the base film comprises a supporting resin layer having a storage elastic modulus in the range of from $1 \times 10^7$ Pa to $1 \times 10^{10}$ Pa at from 23° C. to 200° C., which is a preferred embodiment as the supporting resin layer can support the wafer that is thinned until the thickness is removed to be as low as 150 μm to be flat.

According to the protecting method for a semiconductor wafer, even when the thickness of the wafer in which an integrated circuit is protected by a protection film is ground to be as low as 150 μm, stress by a stretch of a base film in adhering the adhesive film for protection of the semiconductor wafer to the integrated circuit-formed surface of the semiconductor wafer can be relaxed and further warpage in wafers due to the residual stress of the circuit protection film of the wafer can be straightened or avoided and prevented, thus enabling to prevent breakage of wafers.

The second invention is an adhesive film for protection of a semiconductor wafer forming an adhesive layer on one surface of a base film, wherein the base film comprises at least one resin layer having the ratio of residual stress of 0.5% or less after 30 seconds after load at 120° C.

The MFR at 190° C. specified in JIS K6730 of the resin layer having the residual stress of 0.5% or less after 30 seconds after load at 120° C. formed within the base film is from 15 g/10 min to 200 g/10 min, which is a preferred embodiment in view of the fact that stress in attaching the adhesive film for protection of the semiconductor wafer is relaxed.

The base film comprises a supporting resin layer having a storage elastic modulus in the range of from $1 \times 10^7$ Pa to $1 \times 10^{10}$ Pa at from 23° C. to 200° C., which is a preferred embodiment as it has an effect of supporting the wafer that is thinned until the thickness is removed to be as low as 150 μm to be flat.

BEST MODE FOR CARRYING OUT THE INVENTION

The present invention will be described in more detail below.

Firstly, an adhesive film for protection of a semiconductor wafer used in a protecting method for a semiconductor wafer according to the present invention is explained. The adhesive film for protection of the semiconductor wafer of the present invention is produced by forming an adhesive layer on one surface of a base film. In order to protect the adhesive layer, a peeling film is usually adhered to the surface of the adhesive layer. In consideration of an adhesion to the surface of the semiconductor wafer via the surface of the adhesive layer exposed when the peeling film is peeled, a method in which the adhesive agent coating solution is coated on one surface of the peeling film and dried to form the adhesive layer and the resulting adhesive layer is transferred on one surface of the base film is preferable for preventing contamination on the surface of the semiconductor wafer due to the adhesive layer.

The base film preferably comprises at least one resin layer having the residual stress of 0.5% or less and more preferably 0.1% or less after 30 seconds after load at 120° C.

A point of the present invention is to accomplish relaxation of stress generated on an adhesive tape and semiconductor wafer in applying the adhesive tape in the first step by heating the adhesive tape and semiconductor wafer in a heating step. When the ratio of residual stress of the resin layer is excessively high, it is impossible to sufficiently straighten or avoid warpage in a wafer caused by the residual stress of a circuit protecting film of a semiconductor wafer in some cases.

In the resin layer having the ratio of residual stress of 0.5% or less after 30 seconds after load at 120° C., the MFR at 190° C. regulated in JIS K6730 is preferably from 15 g/10 min to 200 g/10 min and further preferably from 30 g/10 min to 100 g/10 min. Resins in which MFR in appearance satisfies the above range by melting, mixing and forming resins having high MFR may be good as well. When the MFR of a resin is too low, it is insufficient to straighten or avoid warpage in a wafer caused by the residual stress of a circuit protecting film of a semiconductor wafer in some cases. On the other hand, when the MFR is excessively high, the melted resin may flow out from the side face of the resin layer, by which a semiconductor wafer and a heating jig may stick to each other at the time of heating the semiconductor wafer in a heating step.

It is preferable to select an appropriate thickness depending on step difference in the wafer surface and existence of bump electrodes as a resin layer having the ratio of residual stress of 0.5% or less after 30 seconds after load at 120° C. has a role in preventing breakage of wafers during the back side processing as well. It is preferable that the thickness of the resin layer is approximately from 20 μm to 300 μm. More preferably, the thickness is from 50 μm to 300 μm. When the thickness is too low, the adhesive film cannot sufficiently follow a projection on the surface of the wafer thereby causing an insufficient adhesion to the projection and, accordingly, a dimple occurs on the back side of the wafer corresponding to the projection in grinding the back side of the wafer in some cases. When the thickness is too great, it becomes difficult to prepare the adhesive film and productivity is affected, thus increasing a production cost in some cases.

As for a resin having the ratio of residual stress of 0.5% or less after 30 seconds after load at 120° C., there can be exemplified, for example, an ethylene-vinyl acetate copolymer, an ethylene-alkyl acrylate copolymer (an alkyl group having 1 to 4 carbon atoms), an ethylene-α-olefin copolymer, and a propylene-α-olefin copolymer.

Commercial products of the ethylene-vinyl acetate copolymer include product names: EVAFLEX (registered trademark) EV420, EVAFLEX EV150 and EVAFLEX V5773W manufactured by Dupont-Mitsui Polychemicals Co., Ltd., those of an ethylene-alkyl acrylate copolymer include product name: EVAFLEX-EEA (registered trademark) manufactured by Dupont-Mitsui Polychemicals Co., Ltd. and those of an ethylene-α-copolymer include product name: TAFMER (registered trademark) manufactured by Mitsui Chemicals, Inc., and the like. p These resin layers can be produced into a film by T-die extrusion molding, inflation extrusion molding and the like. When the MFR is high, a temperature for extrusion and molding is optimized from characteristics of resins and extruding devices. That is, it is desirable to understand temperature dependency on the MFR of a resin and select an extrusion temperature suitable for the device.

The base film preferably has a supporting resin layer having a storage elastic modulus of from $1 \times 10^7$ Pa to $1 \times 10^{10}$ Pa, and more preferably from $1 \times 10^8$ Pa to $1 \times 10^{10}$ Pa, at from 23° C. to 200° C.

A thickness of the supporting resin layer is preferably from 10 μm to 200 μm, and more preferably from 10 μm to 100 μm. When the thickness of the supporting resin layer is too low, an adhesion supported by the adhesive film after grinding the semiconductor wafer is not sufficient, thereby increasing warpage and flexibility of the semiconductor wafer. Accordingly, a bad adsorption or the like occurs during conveyance of the semiconductor wafer, thus causing cracks in wafers in some cases. When the thickness is too great, cutting during adhesion of the adhesive film to the semiconductor wafer and peeling of the adhesive film from the semiconductor wafer become difficult and productivity is affected, thus increasing a production cost in some cases.

As for a supporting resin layer, examples thereof include polyester such as polyethylene terephthalate, polyethylene naphthalate or the like, polyimide, polyether ether ketone, polyether sulfone, polyethylene, polypropylene and a resin layer made of mixed resins thereof. Typical commercial films thereof include polyethylene naphthalates (product name: Teonex manufactured by Teijin Ltd.) and polyimide (product name: Apical manufactured by Kaneka Corp.) and the like.

It is preferable that the adhesive agent forming the adhesive layer of the adhesive film for protection of the semiconductor wafer fully functions as an adhesive agent even under temperature conditions of, for example, approximately 120° C. as the semiconductor wafer is heated after a first stop of adhering the adhesive film for protection of the semiconductor wafer to the circuit-formed surface of the semiconductor wafer. Specific examples thereof include an acrylic adhesive agent, a silicon adhesive agent and the like. The thickness of the adhesive layer is preferably from 3 μm to 100 μm. It is preferable for the adhesive layer that contamination due to adhesive residue or the like does not occur on the surface of the semiconductor wafer after peeling the adhesive film for protection of the semiconductor wafer away from the circuit-formed surface of the wafer (hereinafter referred to also as the surface).

Particularly, it is preferable that the adhesive layer is cross-linked with a cross-linking agent having a reactive functional group, a peroxide, radioactive rays or the like at a high density lest the adhesive strength is increased too much even through a heating step after adhering the adhesive film for protection of the semiconductor wafer to the circuit-formed surface of the semiconductor wafer, and contamination on the surface of the semiconductor wafer is increased. Further, it is preferable that a bad peeling and any adhesive residue do not occur due to the increase in the adhesive strength even when the adhesive film for protection of the semiconductor wafer is adhered to the circuit-formed surface of the semiconductor wafer and then subjected to a heating treatment at a temperature of 150° C. or more. To this effect, it is preferable that the adhesive layer has a storage elastic modulus of at least $1 \times 10^5$ Pa at 150° C. It is desirable that the storage elastic modulus is as high as possible. However, its upper limit is approximately $1 \times 10^8$ Pa.

As a method of forming the adhesive layer having the foregoing characteristics, a method using an acrylic adhesive agent is exemplified. The adhesive layer is formed by using a solution or an emulsion containing an acrylic adhesive agent which is an emulsion polymerization copolymer containing a (meth)acrylic acid alkyl ester monomer unit, a monomer unit having a functional group capable of reacting with a cross-linking agent and a difunctional monomer unit in specific amounts respectively, and a cross-linking agent having two or more functional groups in a molecule for increasing a cohesive force or adjusting an adhesive strength. In case of using the acrylic adhesive agent in the preparation of a solution, the acrylic adhesive agent is separated from an emulsion prepared by emulsion polymerization through desalting or the like, re-dissolved in a solvent or the like, and used. The acrylic adhesive agent has quite a high molecular weight, and is, in many cases, less dissolved or not dissolved in a solvent. Therefore, in view of the cost as well, it is preferable to use the acrylic adhesive agent in the form of an emulsion as such.

As for the acrylic adhesive agent used in the present invention, there can be exemplified, for example, an acrylic adhesive agent prepared by using an acrylic acid alkyl ester, a methacrylic acid alkyl ester or a mixture thereof as a main monomer (hereinafter referred to also as a monomer (A)) and copolymerizing the same with a monomer mixture containing a comonomer having a functional group capable of reacting with a cross-linking agent.

As for the monomer (A), there can be exemplified, for example, an acrylic acid alkyl ester or a methacrylic acid alkyl ester containing an alkyl group having approximately from 1 to 12 carbon atoms (these are generally referred to as a (meth) acrylic acid alkyl ester). Preferable is a (meth)acrylic acid alkyl ester containing an alkyl group having from 1 to 8 carbon atoms. Specifically, there can be exemplified, for example, methyl acrylate, methyl methacrylate, ethyl acrylate, ethyl methacrylate, butyl acrylate, butyl methacrylate, 2-ethylhexyl acrylate or the like. These may be used either singly or in a mixture of two or more. Usually, the amount used of the monomer (A) is preferably in the range of from 10 weight % to 98.9 weight % based on the total amount of all the monomers as raw materials of the adhesive agent. More preferably, it is in the range of from 85 weight % to 95 weight %. By specifying the amount used as the monomer (A) in such a range, a polymer containing from 10 weight % to 98.9 weight %, and preferably from 85 weight % to 95 weight % of the (meth)acrylic acid alkyl ester monomer unit (A) can be prepared.

As for the monomer (B) forming the monomer unit (B) having a functional group capable of reacting with a cross-linking agent, there can be exemplified, for example, acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tertiary-butylaminoethyl acrylate, tertiary-butylaminoethyl methacrylate or the like. Preferable are acrylic acid, methacrylic acid, 2-hydroxylethyl acrylate, 2-hydroxylethyl methacrylate, acrylamide, methacrylamide or the like. One of these may be copolymerized with the main monomer, or two or more thereof may be copolymerized therewith. Generally, it is preferable that the amount used as the monomer (B) having a functional group capable of reacting with a cross-linking agent is in the range of from 1 weight % to 40 weight % based on the total amount of all the monomers as raw materials of the adhesive agent. More preferable amount is in the range of from 1 weight % to 10 weight %. Thus, the polymer having the structural unit (B) with approximately the same composition as the monomer composition can be prepared.

Moreover, in order that the adhesive layer fully functions as an adhesive agent even under temperature conditions in a step of processing the back side of the semiconductor wafer and a step of heating after adhering the adhesive film for protection of the semiconductor wafer to the circuit-formed-surface of the semiconductor wafer or the like, it is advisable to adjust an adhesive strength and the peeling property. As its approach, it is advisable to consider a cross-linking method of a particulate bulk for maintaining a cohesive force of emulsion particles.

In order that the emulsion particles have storage elastic modulus of $1 \times 10^5$ Pa or more even under temperature conditions of from 150° C. to 200° C., it is preferable to improve a cross-linking method to maintain a cohesive force by copolymerizing the difunctional monomer (C). As for the monomer to be copolymerized well, there can be exemplified, for example, ally methacrylate, allyl acrylate, divinylbenzene, vinyl methacrylate, vinyl acrylate, a material in which, for example, both ends are a diacrylate or a dimethacrylate and a structure of a main chain is propylene glycol [product names: PDP-200, PDP-400, ADP-200 and ADP-400, manufactured by Nippon Oils and Fats Co., Ltd.], tetramethylene glycol [product names: ADT-250 and ADT-850, manufactured by Nippon Oils and Fats Co., Ltd.] or a mixture thereof [product names: ADET-1800 and ADPT-4000, manufactured by Nippon Oils and Fats Co., Ltd.] and the like.

When the difunctional monomer (C) is emulsion-copolymerized, the amount used thereof is preferably in the range of from 0.1 weight % to 30 weight % and more preferably from 0.1 weight % to 5 weight % based on all the monomers. Thus, a polymer having the structural unit (C) with approximately the same composition as the monomer composition can be prepared.

In addition to the main monomer constituting the adhesive agent and the comonomer having a functional group capable of reacting with a cross-linking agent, a specific comonomer having a property as a surfactant (hereinafter referred to also as a polymerizable surfactant) may be copolymerized. The polymerizable surfactant has a property of being copolymerized with a main monomer and a comonomer, and also serves as an emulsifying agent in emulsion polymerization. In case of using an acrylic adhesive agent prepared by emulsion polymerization using a polymerizable surfactant, contamination on the wafer surface due to a surfactant does not usually occur. Further, even when slight contamination occurs due to an adhesive layer, it can easily be removed by washing the semiconductor wafer surface with water.

As for such a polymerizable surfactant, there can be exemplified, for example, polyoxyethylene nonylphenyl ether with a polymerizable 1-propenyl group introduced in a benzene ring (product names: Aquaron RN-10, Aquaron RN-20, Aquaron RN-30, Aquaron RN-50 and the like, manufactured by Daiichi Kogyo Seiyaku Co., Ltd.), ammonium salt of sulfuric acid ester of polyoxyethylene nonylphenyl ether with a polymerizable 1-propenyl group introduced in a benzene ring (product names: Aquaron HS-10, Aquaron HS-20 and the like, manufactured by Daiichi Kogyo Seiyaku Co., Ltd.), and sulfosuccinic acid diester having a polymerizable double bond in a molecule (product names: Latemul S-120A, Latemul S-180A and the like, manufactured by Kao Corporation) or the like. Further, a monomer having a polymerizable double bond, such as vinyl acetate, acrylonitrile, styrene or the like may be copolymerized as required.

As for the polymerization reaction mechanism of the acrylic adhesive agent, there can be exemplified, for example, radical polymerization, anionic polymerization, cationic polymerization and the like. Considering the production cost of the adhesive agent, the influence of the functional groups of the monomers, the influence of ions on the surface of the semiconductor wafer and the like, the polymerization by radical polymerization is preferable. As for a radical polymerization initiator in the polymerization by the radical polymerization reaction, there can be exemplified, for example, organic peroxides such as benzoyl peroxide, acetyl peroxide, isobutyl peroxide, octanoyl peroxide, di-tertiary-butyl peroxide, di-tertiary-amyl peroxide and the like, inorganic peroxides such as ammonium persulfate, potassium persulfate, sodium persulfate and the like, and azo compounds such as 2,2'-azobisisobutyronitrile, 2,2'-azobis-2-methylbutyronitrile, 4,4'-azobis-4-cyanovaleric acid or the like.

In the polymerization by the emulsion polymerization method, among these radical polymerization initiators, water-soluble inorganic peroxides such as ammonium persulfate, potassium persulfate, sodium persulfate and the like, and also water-soluble azo compounds having a carboxyl group in a molecule, such as 4,4'-azobis-4-cyanovaleric acid and the like are preferable. In consideration of the influence of ions on the surface of the semiconductor wafer, ammonium persulfate and azo compounds having a carboxyl group in a molecule, such as 4,4'-azobis-4-cyanovaleric acid and the like are more preferable. Azo compounds having a carboxyl group in a molecule, such as 4,4'-azobis-4-cyanovaleric acid and the like are particularly preferable.

The cross-linking agent having two or more cross-linkable functional groups in a molecule for use in the present invention is used to be reacted with the functional group of the acrylic adhesive agent for adjusting an adhesive force and a cohesive force. As for the cross-linking agent, there can be exemplified, for example, epoxy compounds such as sorbitol polyglycidyl ether, polyglycerol polyglycidyl ether, pentaerythritol polyglycidyl ether, diglycerol polyglycidyl ether, glycerol polyglycidyl ether, neopentylglycol diglycidyl ether, resorcin diglycidyl ether and the like; isocyanate compounds such as tetramethylene diisocyanate, hexamethylene diisocyanate, trimethylolpropane toluene diisocyanate 3-adduct, polyisocyanate and the like; aziridine compounds such as trimethylolpropane-tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-azilidinecarboxyamide), N,N'-toluene-2,4-bis(1-azilidinecarboxyamide), trimethylolpropane-tri-β-(2-methylaziridine) propionate and the like; tetrafunctional epoxy compounds such as N,N,N',N'-tetraglycidyl-m-xylenediamine, 1,3-bis(N,N'-diglycidylaminomethyl)cyclohexane, and melamine compounds such as hexamethoxymethylolmelamine and the like. These may be used either singly or in a mixture of two or more.

Ordinarily, the content of the cross-linking agent is preferably in such a range that the number of functional groups in the cross-linking agent is not larger than the number of functional groups in the acrylic adhesive agent. However, when a functional group is newly generated in the cross-linking reaction or when the cross-linking reaction proceeds slowly, the cross-linking agent may be contained in a larger amount as required. The preferable content of the cross-linking agent is in the range of from 0.1 weight part to 15 weight parts per 100 weight parts of the acrylic adhesive agent. When the content is excessively low, the cohesive force of the adhesive layer may be insufficient, the elastic modulus may be less than $1 \times 10^5$ Pa at from 150° C. to 200° C. and heat resistance may be deteriorated in some cases. Accordingly, an adhesive residue due to the adhesive layer tends to occur and the adhesive strength is increased. In this case, the peeling trouble may occur in an automatic peeling machine in peeling the adhesive film for protection away from the semiconductor wafer surface and the semiconductor wafer may be broken in some cases. When the content is too much, the adhesive strength between the adhesive layer and the semiconductor wafer surface is decreased, with the result that a grinding dust may be entered between the semiconductor wafer surface and the adhesive layer in the step of grinding the back side of the semiconductor wafer. Therefore, the semiconductor wafer may be broken or the semiconductor wafer surface may be contaminated in some cases.

The adhesive agent coating solution for use in the present invention may properly contain tackifiers for adjusting a tackiness, such as rosin resins, terpene resins and the like, various surfactants and the like to such an extent that the aim of the present invention is not influenced, in addition to the acrylic adhesive agent prepared by copolymerizing the specific difunctional monomer and the cross-linking agent. Moreover, when the coating solution is an emulsion, film-forming agents such as diethylene glycol monoalkyl ethers and the like may be properly added to such an extent that the aim of the present invention is not influenced. Diethylene glycol monoalkyl ethers and their derivatives used as film-forming agents, when they are present in large amounts in the adhesive layer, might contaminate the semiconductor wafer surface in some cases to such an extent that washing is impossible. For this reason, it is preferable that materials which are volatilized at a drying temperature of the adhesive agent coating solution are used to minimize the residual amounts of these in the adhesive layer.

The adhesive strength of the adhesive film for protection of the semiconductor wafer in the present invention can be properly adjusted in consideration of the processing conditions of the semiconductor wafer, the diameter of the semiconductor wafer, the thickness of the semiconductor wafer after grinding the back side and the like. However, when the adhesive strength is too low, it tends to be, sometimes, difficult to attach the adhesive film for protection to the semiconductor wafer surface and a protecting property of the adhesive film for protection becomes insufficient, whereby the semiconductor wafer may be broken or the semiconductor wafer surface may be contaminated with grinding dusts or the like. Further, when the adhesive strength is too high, a peeling workability might be decreased such that some trouble in the automatic peeling machine may occur in peeling the adhesive film for protection away from the semiconductor wafer surface after processing the semiconductor wafer back side,. or the semiconductor wafer might be broken in some cases. Usually, the adhesive strength is preferably in the range of from 5 g/25 mm to 500 g/25 mm and more preferably from 10 g/25 mm to 300 g/25 mm in terms of an adhesive strength in regard to an SUS304-BA plate.

As a method of coating the adhesive agent coating solution on one surface of the base film or the peeling film, known coating methods such as a roll coater method, a reverse roll coater method, a gravure roll method, a bar coating method, a comma coater method, a die coater method or the like can be applied. The conditions for drying the coated adhesive agent are not particularly limited. Generally, it is preferable to dry the same in a range of from 80° C. to 200° C. for from 10 seconds to 10 minutes. It is more preferable to dry the same at from 80° C. to 170° C. for from 15 seconds to 5 minutes. For satisfactorily promoting the cross-linking reaction of the cross-linking agent with the adhesive agent, the adhesive film for protection may be heated at from 40° C. to 80° C. for approximately from 5 hours to 300 hours around after the drying of the adhesive agent coating solution is completed.

The method of producing the adhesive film for protection of the semiconductor wafer in the present invention is as described above. However, in view of preventing contamination on the surface of the semiconductor wafer, it is preferable that environments of producing all the raw materials such as the base film, the peeling film, the adhesive agent and the like, and environments of preparing, storing, coating and drying the adhesive agent coating solution are maintained so as to comply with cleanliness of class 1000 or less regulated in U.S. Federal Standard 209b.

In a method of processing the semiconductor wafer to which the protecting method for the semiconductor wafer according to the present invention can be applied, a step of adhering the adhesive film for protection of the semiconductor wafer to the surface of the semiconductor wafer and a step of processing the non-circuit-formed surface of the semiconductor wafer are performed in sequence, and then a step of peeling the adhesive film for protection is performed. The subsequent steps are not particularly limited. For example, a method of processing a semiconductor wafer is exemplified in which a step of peeling the adhesive film for protection of the semiconductor wafer, a step of dicing for dividing and cutting the semiconductor wafer, a step of molding for sealing the semiconductor chip with a resin for protecting the outer portion, and the like can be carried out in sequence.

In the protecting method for the semiconductor wafer in the present invention, after the first step of adhering the adhesive film for protection of the semiconductor wafer to the surface of the semiconductor wafer, the second step of heating the semiconductor wafer to which the adhesive film for protection of the semiconductor wafer is adhered is carried out. The heating temperature is preferably from 70° C. to 200° C. and more preferably from 100° C. to 180° C. The heating time is preferably 5 seconds or more and more preferably 10 seconds or more. Then, the third step of processing the back side of the semiconductor wafer and the fourth step of peeling the adhesive film for protection of the semiconductor wafer away from the semiconductor wafer are carried out. As for an adhesive film for protection of the semiconductor wafer which is adhered to the circuit-formed surface of the semiconductor wafer in the first step, above described adhesive film for protection of the semiconductor wafer can be preferably used.

As a desirable embodiment of the protecting method for the semiconductor wafer according to the present invention, first, the peeling film is peeled away from the side of the adhesive layer of the adhesive film for protection of the semiconductor wafer (hereinafter abbreviated as a protecting adhesive film) to expose the surface of the adhesive layer, and the protecting adhesive film is adhered to the surface of the semiconductor wafer via the adhesive layer (first step). Then, the semiconductor wafer to which the adhesive film for protection of the semiconductor wafer is adhered is heated at from 70° C. to 200° C. at least for 5 seconds or more (second step). Subsequently, the semiconductor wafer is fixed to a chuck table of a back side processing machine or the like via the base film layer of the protecting adhesive film to process the back side of the semiconductor wafer (third step). In the third step, all of a step of grinding the back side of the semiconductor wafer, a wet etching step and a polishing step may be carried out or any one of these steps may be carried out. Then, the protecting adhesive film is peeled away (fourth step). Further, after peeling the protecting adhesive film, treatment such as water washing, plasma washing or the like is applied to the surface of the semiconductor wafer as required.

In a heating step, as a method of heating the semiconductor wafer to which the adhesive film for protection of the semiconductor wafer is adhered, there can be exemplified, for example, a method of heating the wafer on a planar plate having a heating device, a method of heating while pressing by means of a press roll having a heating device, a method of heating by blowing warm air generated by a warm air spray device for contact, and a method of heating by irradiation of infrared rays from an infrared lamp.

Conventionally, in the back side processing step, a semiconductor wafer having a thickness of from 500 µm to 1000 µm before grinding has been ground and thinned approximately to from 200 µm to 600 µm depending on the type of a semiconductor chip or the like. On the other hand, by applying the protecting method of the present invention, the thickness can be thinned to be as low as 150 µm. In this case, the minimum possible thickness of the semiconductor wafer is approximately 20 µm. When the thickness of the wafer comes down to be 150 µm or less, a wet etching step or a polishing step can be performed subsequently to the back side grinding. The thickness of the semiconductor wafer before grinding the back side is properly determined depending on the diameter, the type or the like of the semiconductor wafer, and the thickness of the semiconductor wafer after grinding the back side is properly determined depending on the size of the resulting chip, the type of the circuit or the like.

An operation of adhering the protecting adhesive film to the surface of the semiconductor wafer is sometimes manually conducted. However, it is generally conducted with a device referred to as an automatic taping machine to which a protecting adhesive film in a roll state is attached. Examples of such automatic taping machines include Models: ATM- 1000B, ATM-1100 and TEAM-100, manufactured by Takatori Corporation, and Model: STL Series manufactured by Teikoku Seiki K.K. and so forth.

As a way of back side grinding process, known grinding methods such as a through-feed method, an in-feed method and the like are applied. In any of these methods, the grinding of the back side is conducted while cooling a semiconductor wafer and a grindstone by feeding water thereto. Examples of such grinding machines for grinding and processing the back side of wafers include product names: DFG,-841, DFG-850 and DFG-860 manufactured by Disco Corporation, product, name: SVG-502MKII manufactured by Okamoto Machine Tool Works, Ltd. and so forth.

After the completion of the back side grinding, wet etching and polishing are conducted, as required. The wet etching step and the polishing step are conducted for removing warpage generated on the back side of the semiconductor wafer, further thinning the semiconductor wafer, removing an oxide layer or the like, conducting pretreatment in forming an electrode on the back side, and the like. An etching solution is properly selected according to the foregoing purposes.

After the completion of the back side grinding process, chemical solution treatment and the like of the wafer, the adhesive film is peeled away from the surface of the wafer. An operation of peeling the adhesive film away from the surface of the wafer is sometimes manually conducted. However, it is generally conducted by a device referred to as an automatic peeling machine. In the operation by the automatic peeling machine, the adhesive film is peeled away by fixing a thin-processed wafer on a vacuum chuck table. In peeling the adhesive film, it is desirable to heat the adhesive film through the chuck table. The preferred heating temperature can be properly selected within the temperature range of from 50° C. to 90° C. depending on the kind of a resin to be used. Peeling of the adhesive film may be conducted in a state that the adhesive film is fixed to a dicing tape or the like.

Examples of such automatic peeling machines include Models: ATRM-2000B and ATRM-2100 manufactured by Takatori Corporation, Model: HR-8500II manufactured by Nitto Seiki Co., Ltd., Model: STP Series manufactured by Teikoku Seiki Co., Ltd. and so forth.

The surface of the semiconductor wafer after peeling the protecting adhesive film is washed as required. As for the washing method, there can be exemplified, for example, wet washing such as water washing, solvent washing or the like, dry washing such as plasma washing or the like, and the like. In the wet washing, ultrasonic washing may be used together. These washing methods are properly selected depending on the contamination condition on the surface of the semiconductor wafer.

As for the semiconductor wafer to which the protecting method for the semiconductor wafer in the present invention can be applied, there can be exemplified, for example, a silicon wafer as well as wafers of germanium, gallium-arsenic, gallium-phosphorus, gallium-arsenic-aluminum and the like.

EXAMPLES

The present invention is now more specifically illustrated below with reference to Examples. In all of Examples and Comparative Examples to be described below, preparation and coating of an adhesive agent coating solution, adhesion of an adhesive film, back side grinding of a semiconductor silicon wafer, peeling of an adhesive film and the like were carried out in environments maintained so as to comply with cleanliness of class 1000 or less regulated in U.S. Federal Standard 209b. The present invention is not limited to these Examples. Further, various properties described in Examples were measured by the following methods.

1. Method of Measuring Various Properties 1-1. Measurement of an Adhesive Force (g/25 mm)

An adhesive force is measured according to a method regulated in JIS Z0237-1991 except for conditions defined below. Each of adhesive films obtained by each of Examples and Comparative Examples is adhered to a surface of a rectangular SUS304-BA plate of 5 cm×20 cm (regulated in JIS G4305-1991) via its adhesive layer in an atmosphere of 23° C., cut in the same size, and allowed to stand for 60 minutes. Here, the adhesive film is adhered such that the machine direction (hereinafter referred to also as the MD) is oriented to the side of 20 cm of the SUS304-BA plate and the direction orthogonal to the machine direction (hereinafter referred to also as the TD) is oriented to the side of 5 cm of the SUS304-BA plate. One end of the sample in its MD is held and the sample is peeled away from the surface of the SUS304-BA plate at a peel angle of 180° and a peel rate of 300 mm/min. At this time, a stress is measured, and converted in terms of a width of 25 mm.

1-2. Storage Elastic Modulus (Pa)

Supporting Resin Layer

A portion of a base film layer of an adhesive film for protection of a semiconductor wafer is cut to prepare a rectangular sample (MD: 30 mm and TD: 10 mm). A storage elastic modulus (machine direction) is measured at, from 0° C. to 300° C. using a dynamic viscoelasticity measuring device (Model: RSA-II, manufactured by Rheometrics Inc.). A measurement frequency is 1 Hz, and warpage is in a range of from 0.01% to 0.1%.

1-3. Residual Stress

A square sample (MD: 20 mm and TD: 20 mm) is prepared. Stress relaxation after load at 120° C. is measured using a dynamic viscoelasticity measuring device (Models: RMS-800 and Complete, manufactured by Rheometrics Inc.). The ratio of residual stress (%) after 30 seconds is obtained.

1-4. Melt Flow Rate (g/10 min)

Methods regulated in JIS K6730 were referred to. A measurement temperature was 190° C.

1-5. Evaluation of Warpage Amount in a Semiconductor Wafer

A protecting adhesive film is adhered to a surface of an 8-inch silicon mirror wafer (hereinafter abbreviated as a wafer, diameter: approximately 200 mm, thickness: 740 μm) having no films or the like attached on a surface of a semiconductor wafer via its adhesive layer using a hand roller. And then the wafer is heated using a hot plate (Model: TP-320, manufactured by Advantech Co., Ltd.). After cooling, the wafer back side is ground using a back side grinding machine (Model: DFG860, manufactured by Disco Corporation) for thinning until its thickness is reduced down to 50 μm. Thereafter, the wafer facing the protecting adhesive film-attached surface upward is put on a flat plate in a state that the protecting adhesive film is adhered to the surface of the wafer to measure the maximum distance between the flat plate and the wafer back side for the amount of warpage in wafers. Ten wafers are evaluated and its average value is indicated.

1-6. Breakage of a Semiconductor Wafer (Number of Wafers)

The number of broken semiconductor wafers in a step of grinding a back side of a semiconductor wafer and a step of peeling a protecting adhesive film is described. Ten wafers are evaluated and the appropriate number of broken wafers is indicated.

2. Preparation Example of a Protecting Adhesive Film 2-1. Preparation Example 1 of a Base Film As a heat-resistant film layer, a polyethylene naphthalate film (product name: TEONEX, manufactured by Teijin Dupont Ltd.) having a thickness of 50 μm was selected. This was laminated with an ethylene-vinyl acetate copolymer (product name: EV150, manufactured by Dupont-Mitsui Polychemicals Co., Ltd.) film (thickness: 195 μm) having a melt flow rate of 150 g/10 min at 190° C. by conducting a corona discharge treatment. A corona discharge treatment was also applied to the side of the ethylene-vinyl acetate copolymer forming an adhesive layer to prepare a base film 1 having a total thickness of 245 μm. The ratio of residual stress of EVA having a melt flow rate of 150 g/10 min was 0.02%.

2-2. Preparation Example 2 of a Base Film

As a heat-resistant film layer, a polyethylene naphthalate film (product name: TEONEX, manufactured by Teijin Dupont Ltd.) having a thickness of 50 μm was selected. This was laminated with an ethylene-vinyl acetate copolymer (product name: EV150, manufactured by Dupont-Mitsui Polychemicals Co., Ltd.) film (thickness: 50 μm) having a melt flow rate of 150 g/10 min at 190° C. by conducting a corona discharge treatment. A corona discharge treatment was also applied to the side of the ethylene-vinyl acetate copolymer forming an adhesive layer to prepare a base film 2 having a total thickness of 100 μm. The ratio of residual stress of EVA having a melt flow rate of 150 g/10 min was 0.02%.

2-3. Preparation Example 3 of a Base Film

As a heat-resistant film layer, a polyethylene naphthalate film (product name: TEONEX, manufactured by Teijin Dupont Ltd.) having a thickness of 50 μm was selected. This was laminated with an ethylene-vinyl acetate copolymer (product name: EV250, manufactured by Dupont-Mitsui Polychemicals Co., Ltd.) film (thickness: 195 μm) having a melt flow rate of 15 g/10 min at 190° C. by conducting a corona discharge treatment. A corona discharge treatment was also applied to the side of the ethylene-vinyl acetate copolymer forming an adhesive layer to prepare a base film 3 having a total thickness of 245 μm. The ratio of residual stress of EVA having a melt flow rate of 15 g/10 min was 0.22%.

2-4. Preparation Example 4 of a Base Film

As a heat-resistant film layer, a polyethylene naphthalate film (product name: TEONEX, manufactured by Teijin Dupont Ltd.) having a thickness of 50 μm was selected. This was laminated with an ethylene-α-olefin copolymer (product name: Tafmer (registered trademark) A-4070, manufactured by Mitsui Chemicals, Inc.) film (thickness: 195 μm) having a melt flow rate of 3 g/10 min at 190° C. by conducting a corona discharge treatment. A corona discharge treatment was also applied to the side of the ethylene-α-olefin copolymer forming an adhesive layer to prepare a base film 4 having a total thickness of 245 μm. The ratio of residual stress of ethylene-α-olefin copolymer having a melt flow rate of 3 g/10 min was 0.02%.

2-5. Comparative Preparation Example 1 of a Base Film

As a heat-resistant film layer, a polyethylene naphthalate film (product name: TEONEX, manufactured by Teijin Dupont Ltd.) having a thickness of 50 μm was selected. This was laminated with an ethylene-vinyl acetate copolymer (product. name: EV460, manufactured by Dupont-Mitsui Polychemicals Co., Ltd.) film (thickness: 195 μm) having a melt flow rate of 2.5 g/10 min at 190° C. by conducting a corona discharge treatment. A corona discharge treatment was also applied to the side of the ethylene-vinyl acetate copolymer forming an adhesive layer to prepare a base film 5 having a total thickness of 245 μm. The ratio of residual stress of EVA having a melt flow rate of 2.5 g/10 min was 8%.

2-6. Preparation Example of an Adhesive Agent

A polymerization reaction vessel was charged with 150 weight parts of deionized water, 0.625 weight part of 4,4'-azobis-4-cyanovaleric acid (product name: ACVA, manufactured by Otsuka Chemical Co., Ltd.) as a polymerization initiator, 62.25 weight parts of 2-ethylhexyl acrylate, 18 weight parts of n-butyl acrylate and 12 weight parts of methyl methacrylate as a monomer (A), 3 weight parts of 2-hydroxyethyl methacrylate, 2 weight parts of methacrylic acid and 1 weight part of acrylamide as a monomer (B), 1 weight part of polytetramethylene glycol diacrylate (product name: ADT-250, manufactured by Nippon Oils and Fats Co., Ltd.) as a monomer (C), and 0.75 weight part of ammonium salt of sulfuric acid ester of polyoxyethylene nonylphenyl ether (average number of moles added of ethylene oxide: approximately 20) with a polymerizable 1-propenyl group introduced in a benzene ring (product name: Aquaron HS-10, manufactured by Daiichi Kogyo Seiyaku Co., Ltd.) as a water-soluble comonomer. The reactants were stirred at from 70° C. to 72° C. for 8 hours to prepare an acrylic resin emulsion. This was neutralized with 9 weight % of aqueous ammonia (pH=7.0) to prepare an acrylic adhesive agent (adhesive agent 1) having a solid content of 42.5 weight %.

Method of Preparing an Adhesive Agent Coating Solution 1

100 weight parts of the thus obtained adhesive agent was collected, and further adjusted to pH of 9.5 with the addition of 9 weight % of aqueous ammonia. Subsequently, 1.6 weight parts of an aziridine cross-linking agent (product name: Chemitight PZ-33, manufactured by Nippon Shokubai Kagaku Kogyo Co., Ltd.) was added to prepare an adhesive agent coating solution 1 forming the adhesive layer.

2-7. Preparation Example 1 of an Adhesive Film

The adhesive agent coating solution 1 was coated on a polypropylene film (peeling film, thickness: 50 μm) using a roll coater, and dried at 120° C. for 2 minutes to prepare an adhesive layer having a thickness of 10 μm. A side of the base film 1 on which has been subjected to a corona discharge treatment was bonded to the thus-formed adhesive layer, and pressed to transfer the adhesive layer. After the transfer, the film was heated at 60° C. for 48 hours, and then cooled down to room temperature to prepare an adhesive film 1 for protection of the semiconductor wafer. The adhesive strength was 100 g/25 mm.

2-8. Preparation Example 2 of an Adhesive Film

The adhesive coating solution 1 was coated on a polypropylene film (peeling film, thickness: 50 μm) using a roll coater, and dried at 120° C. for 2 minutes to prepare an adhesive layer having a thickness of 10 μm. A side of the base film 2 which has been subjected to a corona discharge treatment was bonded to the thus-formed adhesive layer, and pressed to transfer the adhesive layer. After the transfer, the film was heated at 60° C. for 48 hours, and then cooled down to room temperature to prepare an adhesive film 2 for protection of the semiconductor wafer. The adhesive strength was 90 g/25 mm.

2-9. Preparation Example 3 of an Adhesive Film

The adhesive coating solution 1 was coated on a polypropylene film (peeling film, thickness: 50 μm) using a roll-coater, and dried at 120° C. for 2 minutes to prepare an adhesive layer having a thickness of 10 μm. A side of the base film 3 which has been subjected to a corona discharge treatment was bonded to the thus-formed adhesive layer, and pressed to transfer the adhesive layer. After the transfer, the film was heated at 60° C. for 48 hours, and then cooled down to room temperature to prepare an adhesive film 3 for protection of the semiconductor wafer. The adhesive strength was 105 g/25 mm.

2-10. Preparation Example 4 of an Adhesive Film

The adhesive coating solution 1 was coated on a polypropylene film (peeling film, thickness: 50 μm) using a roll coater, and dried at 120° C. for 2 minutes to prepare an adhesive layer having a thickness of 10 μm. A side of the base film 4 which has been subjected to a corona discharge treatment was bonded to the thus-formed adhesive layer, and pressed to transfer the adhesive layer. After the transfer, the film was heated at 60° C. for 48 hours, and then cooled down to room temperature to prepare an adhesive film 4 for protection of the semiconductor wafer. The adhesive strength was 100 g/25 mm.

2-11. Comparative Preparation Example of an Adhesive Film

The adhesive coating solution 1 was coated on a polypropylene film (peeling film, thickness: 50 μm) using a roll coater, and dried at 120° C. for 2 minutes to prepare an adhesive layer having a thickness of 10 μm. A side of the base film 5 which has been subjected to a corona discharge treatment was bonded to the thus-formed adhesive layer, and pressed to transfer the adhesive layer. After the transfer, the film was heated at 60° C. for 48 hours, and then cooled down to room temperature to prepare an adhesive film 5 for protection of the semiconductor wafer. The adhesive strength was 100 g/25 mm.

3-1. Example 1

An adhesive film 1 for protection of a semiconductor wafer was heated from the wafer back side by a hot plate set to 70° for 10 seconds in a state that the adhesive film 1 was adhered to the whole surface of the 10 semiconductor wafers (mirror wafer, diameter: 8 inches, thickness: 750 μm). Subsequently, the wafer back side was ground until its thickness was reduced down to 50 μm using a back side grinding machine (Model: DFG860, manufactured by Disco Corporation). After grinding, the grinding-completed semiconductor wafer was encased into a cassette that afforded to encase 25 wafers by means of a robot arm. No breakage of wafers due to interference between the semiconductor wafer and the cassette caused by warpage in the semiconductor wafer at this time and no bad adsorption between the wafer and the robot arm during conveyance occurred. This was indicated as OK in Table 1.

Further, the amount of warpage in the semiconductor wafer after grinding was measured. As a result, the amount of warpage in the wafer was 1.9 mm in the direction of the surface where the adhesive film for protection of the semiconductor wafer was attached. The results obtained are shown in Table 1.

3-2. Example 2

Processing of a semiconductor wafer was conducted in the same manner as that described in Example 1, except that heating from the wafer back side was conducted at 180° for 300 seconds. No breakage of wafers during encasement into the cassette and no conveyance failure occurred. After grinding the back side, the amount of warpage in the wafer was 1.1 mm in the direction of the surface where the adhesive film for protection of the semiconductor wafer was attached. The results obtained are shown in Table 1.

3-3. Example 3

Processing of a semiconductor wafer was conducted in the same manner as that described in Example 1, except that heating from the wafer back side was conducted at 100° C. for 30 seconds using the adhesive film 2 for protection of the semiconductor wafer. No breakage of wafers during encasement into the cassette and no conveyance failure occurred. After grinding the back side, the amount of warpage in the wafer was 4.6 mm in the direction of the surface where the adhesive film for protection of the semiconductor wafer was attached. The results obtained are shown in Table 1.

3-4. Example 4

Processing of a semiconductor wafer was conducted in the same manner as that described in Example 3, except that the adhesive film 3 for protection of the semiconductor wafer was used. No breakage of wafers during encasement into the cassette and no conveyance failure occurred. After grinding the back side, the amount of warpage in the wafer was 4.5 mm in the direction of the surface where the adhesive film for protection of the semiconductor wafer was attached. The results obtained are shown in Table 1.

3-5. Example 5

Processing of a semiconductor wafer was conducted in the same manner as that described in Example 3, except that the adhesive film 4 for protection of the semiconductor wafer was used. No breakage of wafers during encasement into the cassette and no conveyance failure occurred. After grinding the back side, the amount of warpage in the wafer was 1.5 mm in the direction of the surface where the adhesive film for protection of the semiconductor wafer was attached. The results obtained are shown in Table 1.

3-6. Comparative Example 1

Processing of a semiconductor wafer was conducted in the same manner as that described in Example 3, except that the adhesive film 5 for protection of the semiconductor wafer was used. As a result, wafers and the cassette were interfered due to warpage in 5 wafers out of 10 wafers during encasement into the cassette, thus causing breakage. Further, after grinding wafers, the robot arm failed to convey 3 wafers out of 10 wafers back into the cassette. After grinding the back side, the amount of warpage in the wafer was 12.1 mm in the direction of the surface where the adhesive film for protection of the semiconductor wafer was attached. The results obtained are shown in Table 1.

3-7. Comparative Example 2

Processing of a semiconductor wafer was conducted in the same manner as that described in Example 3, except that heating from the wafer back side was omitted using the adhesive film 5 for protection of the semiconductor wafer. As a result, wafers and the cassette were interfered due to warpage in 5 wafers out of 10 wafers during encasement into the cassette, thus causing breakage. Further, after grinding wafers, the robot arm failed to convey 4 wafers out of 10 wafers back into the cassette. After grinding the back side, the amount of warpage in the wafer was 13.0 mm in the direction of the surface where the adhesive film for protection of the semiconductor wafer was attached. The results obtained are shown in Table 1.

TABLE 1

| | Example 1 | Example 2 | Example 3 | Example 4 | Example 5 | Comparative Example 1 | Comparative Example 2 |
|---|---|---|---|---|---|---|---|
| No. of base film | 1 | 1 | 2 | 3 | 4 | 5 | 5 |
| Thickness of base film [µm] | 245 | 245 | 100 | 245 | 245 | 245 | 245 |
| Supporting Resin Layer | PEN | PEN | PEN | PEN | PEN | PEN | PEN |
| Thickness of supporting resin layer [µm] | 50 | 50 | 50 | 50 | 50 | 50 | 50 |
| Storage elastic modulus of supporting layer Gpa (23° C., 200° C.) | 5.3, 0.19 | 5.3, 0.19 | 5.3, 0.19 | 5.3, 0.19 | 5.3, 0.19 | 5.3, 0.19 | 5.3, 0.19 |
| Resin layer | EVA | EVA | EVA | EVA | TAFMER | EVA | EVA |
| Thickness of resin layer [µm] | 195 | 195 | 50 | 195 | 195 | 195 | 195 |
| MFR of resin layer [α/10 min] | 150 | 150 | 150 | 15 | 3 | 2.5 | 2.5 |
| Residual stress of resin layer after 30 seconds [%] | 0.02 | 0.02 | 0.02 | 0.22 | 0.02 | 8 | 8 |
| Heating temperature before wafer grinding [° C.] × heating time [s] | 70 × 10 | 180 × 300 | 100 × 30 | 100 × 30 | 100 × 30 | 100 × 30 | — |
| Amount of warpage in wafers after completion of wafer grinding [mm] | 1.9 | 1.1 | 4.6 | 4.5 | 1.5 | 12.1 | 13.0 |
| Breakage during encasement into casette | OK | OK | OK | OK | OK | 5 wafers broken | 5 wafers broken |
| Bad adhesion during conveyance | OK | OK | OK | OK | OK | 3 bad wafers | 4 bad wafers |

PEN: polyethylene naphthalate,
EVA: ethylene-vinyl acetate copolymer

The invention claimed is:

1. A protecting method for a semiconductor wafer in a step of processing a semiconductor wafer with an adhesive film for protection of the semiconductor wafer comprising an adhesive layer formed on one surface of a base film, the method comprising a first step of adhering the adhesive layer of the adhesive film to a circuit-formed surface of the semiconductor wafer, a second step of heating the semiconductor wafer to which the adhesive film for protection of the semiconductor wafer is adhered, a third step of fixing the semiconductor wafer to which the adhesive film for protection of the semiconductor wafer is adhered on a grinding machine or an abrasive machine, and processing a non-circuit-formed surface of the semiconductor wafer, and a fourth step of peeling the adhesive film for protection of the semiconductor wafer from the semiconductor wafer wherein the heating of the second step is conducted prior to the processing of the semiconductor wafer.

2. The protecting method for a semiconductor wafer according to claim 1, wherein the base film comprises at least one resin layer having a ratio of residual stress of 0.5% or less after being subjected to a load in an environment at 120° C. for 30 seconds.

3. The protecting method for a semiconductor wafer according to claim 2, wherein the melt flow rate (hereinafter referred to also as MFR) at 190° C. specified in JIS K6730 of the resin layer having a ratio of residual stress of 0.5% or less after being subjected to a load in an environment at 120° C. for 30 seconds is from 15 g/10 min to 200 g/10 min.

4. The protecting method for a semiconductor wafer according to claim 1, wherein the base film comprises a supporting resin layer having a storage elastic modulus in the range of from $1\times10^7$ Pa to $1\times10^{10}$ Pa at from 23° C. to 200° C.

5. The protecting method for a semiconductor wafer according to claim 1, wherein a thickness of the semiconductor wafer after the third step is 150 μm or less.

6. The protecting method for a semiconductor wafer according to claim 1, wherein the second step of heating the semiconductor wafer to which the adhesive film for protection of the semiconductor wafer is adhered is carried out at a heating temperature of from 70° C. to 200° C.

* * * * *